(12) United States Patent
Peng et al.

(10) Patent No.: US 11,152,320 B2
(45) Date of Patent: Oct. 19, 2021

(54) SEMICONDUCTOR PACKAGE STRUCTURE AND METHOD OF THE SAME

(71) Applicant: INPAQ TECHNOLOGY CO., LTD., Miaoli (TW)

(72) Inventors: Yu-Ming Peng, Taichung (TW); Wei-Lun Hsu, Miaoli County (TW); Chu-Chun Hsu, Miaoli County (TW); Hong-Sheng Ke, Changhua County (TW); Yu Chia Chang, Taichung (TW)

(73) Assignee: INPAQ TECHNOLOGY CO., LTD., Miaoli (TW)

( * ) Notice: Subject to any disclaimer, the term of this patent is extended or adjusted under 35 U.S.C. 154(b) by 0 days.

(21) Appl. No.: 15/237,372

(22) Filed: Aug. 15, 2016

(65) Prior Publication Data

US 2017/0011961 A1 Jan. 12, 2017

Related U.S. Application Data

(62) Division of application No. 14/795,331, filed on Jul. 9, 2015, now abandoned.

(51) Int. Cl.
*H01L 23/00* (2006.01)
*H01L 23/31* (2006.01)
(Continued)

(52) U.S. Cl.
CPC .......... *H01L 24/06* (2013.01); *H01L 21/7685* (2013.01); *H01L 21/76885* (2013.01); *H01L 23/293* (2013.01); *H01L 23/3121* (2013.01); *H01L 23/3192* (2013.01); *H01L 23/49816* (2013.01); *H01L 23/5283* (2013.01); *H01L 23/53223* (2013.01); *H01L 23/53238* (2013.01); *H01L 23/53252* (2013.01); *H01L 23/53266* (2013.01); *H01L 24/00* (2013.01); *H01L 24/03* (2013.01); *H01L 24/19* (2013.01); *H01L 24/20* (2013.01); *H01L 2224/02311* (2013.01); *H01L 2224/02373* (2013.01); *H01L 2224/02381* (2013.01); *H01L 2224/04105* (2013.01); *H01L 2224/24137* (2013.01); *H01L 2224/32225* (2013.01); *H01L 2224/73267* (2013.01);
(Continued)

(58) Field of Classification Search
CPC ....................................................... H01L 24/19
USPC ....................................................... 438/127
See application file for complete search history.

(56) References Cited

U.S. PATENT DOCUMENTS

7,075,181 B2 * 7/2006 Wakabayashi .......... H01L 24/97
257/734
8,846,453 B1 * 9/2014 Hsu ........................ H01L 24/03
257/E21.15
(Continued)

*Primary Examiner* — Hsin Yi Hsieh
(74) *Attorney, Agent, or Firm* — Muncy, Geissler, Olds & Lowe, P.C.

(57) ABSTRACT

The disclosure provides a semiconductor package structure, including a substrate having a front side and a back side, a first insulating layer disposed on the front side of the substrate, and a die disposed on the first insulating layer; wherein the die includes a first die pad and a second die pad, the first die pad coupled to a first portion of a metal layer, the second die pad coupled to a second portion of the metal layer, and the first portion of the metal layer and the second portion of the metal layer spaced apart by a second insulating layer. An associated semiconductor packaging method and another semiconductor package structure are also disclosed.

6 Claims, 14 Drawing Sheets

(51) Int. Cl.
*H01L 21/768* (2006.01)
*H01L 23/29* (2006.01)
*H01L 23/528* (2006.01)
*H01L 23/532* (2006.01)
*H01L 23/498* (2006.01)

(52) U.S. Cl.
CPC ............... *H01L 2224/92244* (2013.01); *H01L 2924/01029* (2013.01); *H01L 2924/01047* (2013.01); *H01L 2924/19041* (2013.01); *H01L 2924/19042* (2013.01); *H01L 2924/19043* (2013.01)

(56) References Cited

U.S. PATENT DOCUMENTS

| | | | | |
|---|---|---|---|---|
| 2005/0140007 | A1* | 6/2005 | Jobetto | H01L 23/16 257/738 |
| 2009/0208868 | A1* | 8/2009 | Okazaki | C08G 73/10 430/281.1 |
| 2013/0087914 | A1* | 4/2013 | Yang | H01L 21/563 257/738 |
| 2014/0070403 | A1* | 3/2014 | Pan | H01L 21/56 257/737 |

* cited by examiner

SEMICONDUCTOR PACKAGE STRUCTURE AND METHOD OF THE SAME

CROSS-REFERENCE TO RELATED APPLICATION

This is a divisional application of U.S. application Ser. No. 14/795,331, filed Jul. 9, 2015.

TECHNICAL FIELD

The present disclosure relates to a semiconductor package structure and associated semiconductor packaging method.

DISCUSSION OF THE BACKGROUND

Within the electronics industry, vigorous development has focused on multi-function and high-performance capabilities of electronic products. To meet the high-integration and miniaturization packaging requirements of semiconductor package structures, a circuit board for carrying active and passive components and wirings has evolved from a single-layer board into a multilayer board. In this way, an area of wire routing can be expanded in a limited space on the circuit board by employing an interlayer connection technique, which also complies with the requirements of high density integrated circuits.

A conventional semiconductor package structure includes a wire bonded semiconductor die adhered to a front side of a substrate. The semiconductor die can be coupled to outside electrical components by disposing solder balls on a back side of the substrate. Despite the objective of achieving a high pin count, electrical efficiency is hard to improve at high frequencies due to a high impedance characteristic caused by long wiring. In addition, fabrication of the conventional semiconductor package structure is highly complicated.

Figure 1:
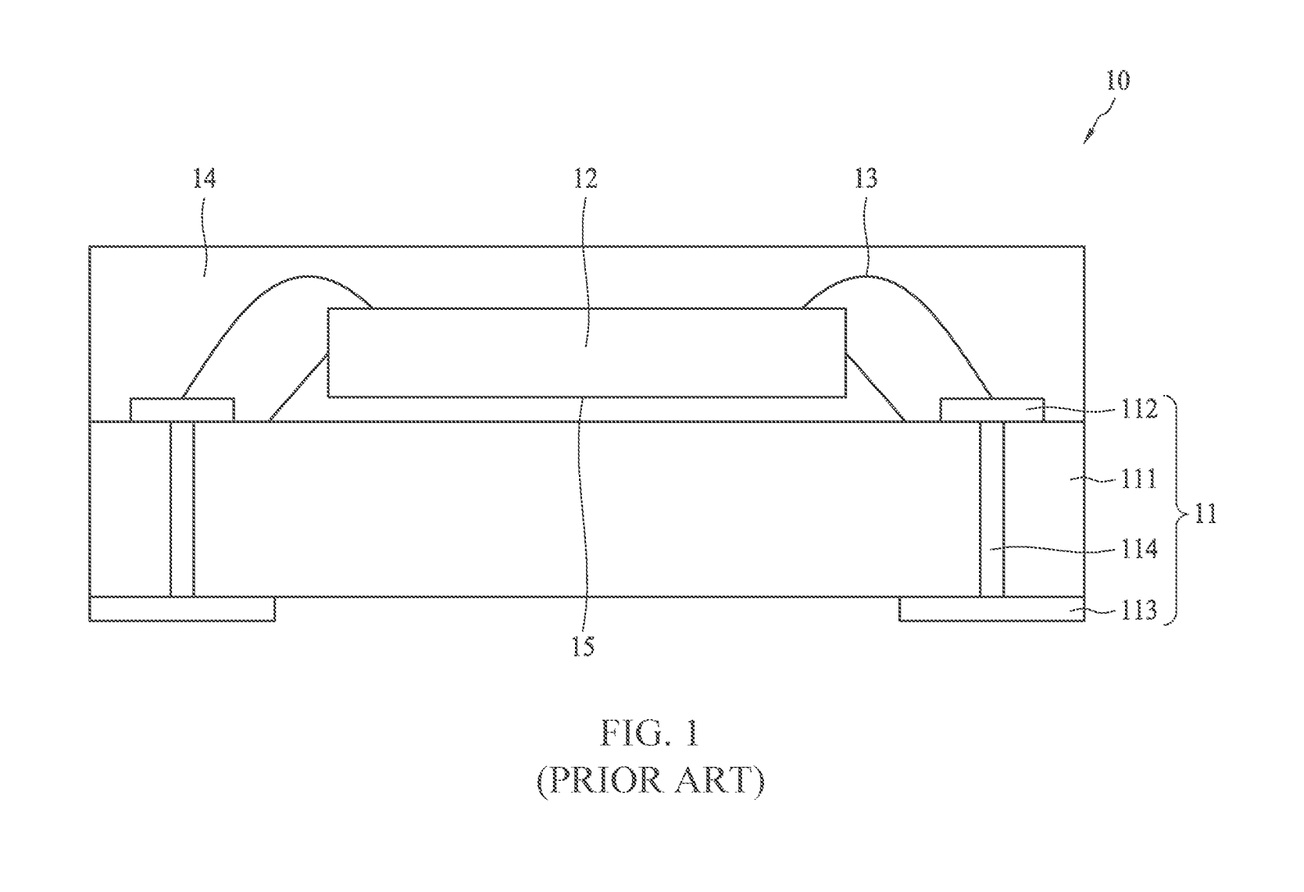
FIG. 1 is a cross-sectional view of a conventional semiconductor package structure.

FIG. 1 is a cross-sectional view of a conventional semiconductor package structure. The semiconductor package structure 10 includes a substrate 11, a die 12, a plurality of metal wires 13 and an encapsulation adhesive 14. The die 12 is fixed on a surface of the substrate 11 by an adhesive 15. The die 12 is further electrically connected to a plurality of bonding pads 112 of the substrate 11 via the plurality of metal wires 13. An insulating layer 111 of the substrate 11 includes a plurality of conductive pillars 114, thus the plurality of bonding pads 112 can be electrically connected to a plurality of pads 113 on a backside of the substrate 11 via the plurality of conductive pillars 114. Further, the plurality of pads 113 can be bonded to the solder balls (not shown in FIG. 1), thus forming a ball grid array (BGA) package. In order to protect the die 12 and the plurality of metal wires 13 from being damaged, the die 12 and the plurality of metal wires 13 are capsulated in the encapsulation adhesive 14.

The aforementioned semiconductor package structure requires not only complicated operations such as die adhesion, wire bonding and encapsulating, but also a lead frame or circuit board to carry the die. Consequently, the cost of a package cannot be effectively reduced. How to further improve the complex semiconductor packaging method has become an urgent issue in this field.

SUMMARY

One of the objectives of the present invention is to disclose semiconductor package structures and a method of the same, to solve the issue.

According to a first aspect of the present invention, a semiconductor package structure is disclosed. The semiconductor package structure includes a substrate having a front side and a back side; a first insulating layer disposed on the front side of the substrate; and a die disposed on the first insulating layer; wherein the die comprises a first die pad and a second die pad, the first die pad is coupled to a first portion of a metal layer, the second die pad is coupled to a second portion of the metal layer, and the first portion of the metal layer and the second portion of the metal layer are spaced apart by a second insulating layer.

According to a second aspect of the present invention, a semiconductor package structure is disclosed. The semiconductor package structure includes a substrate; a first insulating layer disposed on the substrate; a first die disposed on the first insulating layer; and a second die disposed on the first insulating layer; and wherein the first die comprises a first die pad and a second die pad, the second die comprises a third die pad and a fourth die pad, the first die pad is coupled to a first portion of a metal layer, the second die pad is coupled to the third die pad via a second portion of the metal layer, the fourth die pad is coupled to a third portion of the metal layer, and the first portion, the second portion and the third portion of the metal layer are spaced apart by a second insulating layer.

According to a third aspect of the present invention, a semiconductor packaging method is disclosed. The semiconductor packaging method includes: providing a substrate having a front side and a back side; disposing a first insulating layer on the front side of the substrate; disposing a die on the first insulating layer, wherein the die comprises a first die pad and a second die pad; disposing a second insulating layer on the first insulating layer, the die, the first die pad and the second die pad; removing a portion of the second insulating layer to form a first window and a second window, so as to expose the first die pad and the second die pad; disposing a first metal layer on the second insulating layer, the first window and the second window, and the first metal layer being coupled to the first die pad and the second die pad; disposing a third insulating layer on the first metal layer; removing a portion of the third insulating layer to form a third window and a fourth window, so as to expose the first metal layer; disposing a second metal layer on the first metal layer in the third window and the fourth window; and removing the third insulating layer and a portion of the first metal layer, so as to uncouple the first die pad from the second die pad via the first metal layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 2:
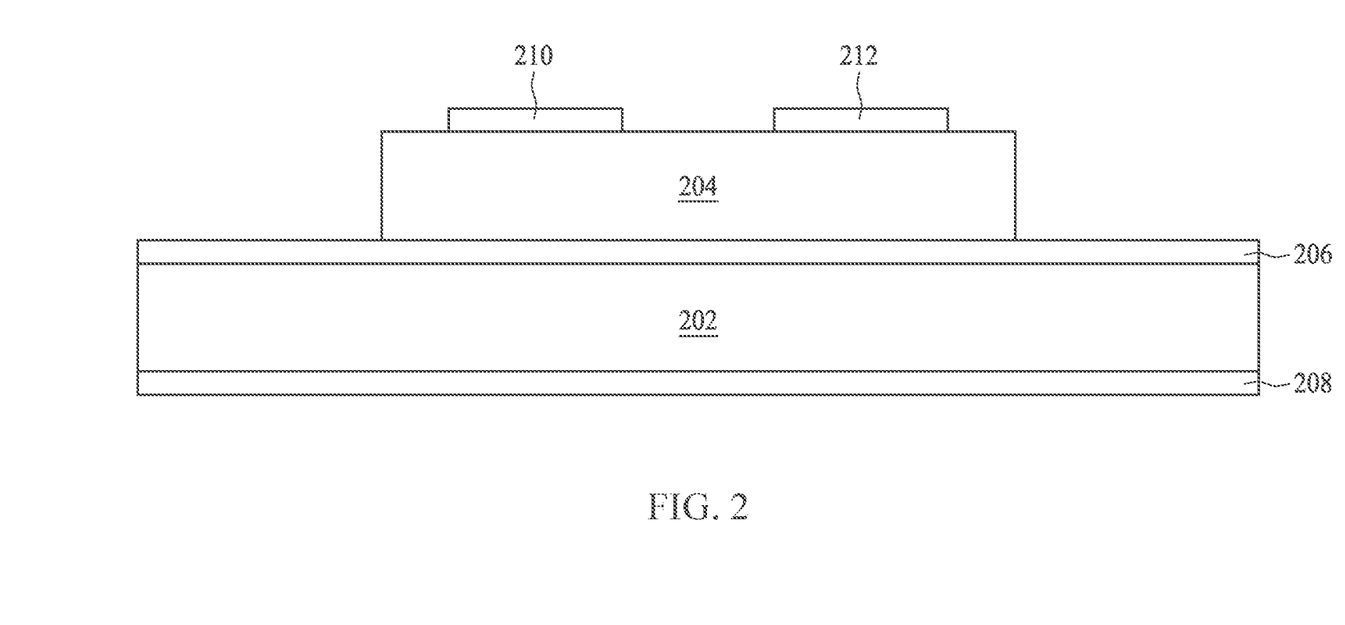
FIGS. 2-11 are cross-sectional views of a semiconductor package structure during a process of a semiconductor packaging method according to an embodiment of the disclosure.

FIGS. 2-11 are cross-sectional views of a semiconductor package structure during a process of a semiconductor packaging method according to an embodiment of the disclosure. Initially, a plurality of dies are obtained by sawing a wafer. At least one of the plurality of dies is arranged on a substrate 202 according to a predefined matrix and/or die size after a pick and place process. The substrate 202 is an insulating substrate. In order to facilitate illustration of the present disclosure, only a die 204 is depicted in the embodiment shown in FIGS. 2-11. As shown in FIG. 2, a first insulating layer 206 and a protection layer 208 are adhered to a front side and a back side of the substrate 202 respectively. It is preferred that the first insulating layer 206 and the protection layer 208 are dry films including constituents selected from at least one of polyimide, epoxy, benzocyclobutene resin and polymer. A curing process may be adopted to firmly bind the die 204 on the surface of the first insulating layer 206. The protection layer 208 may be employed to protect the substrate 202, in order to prevent fragmentation of the substrate 202. However, this is not a limitation of the disclosure. In some embodiments, the protection layer 208 may be omitted. In this embodiment, the die 204 includes a first die pad 210 and a second die pad 212. In some embodiments, the die 204 may include more or less die pads.

Figure 3:
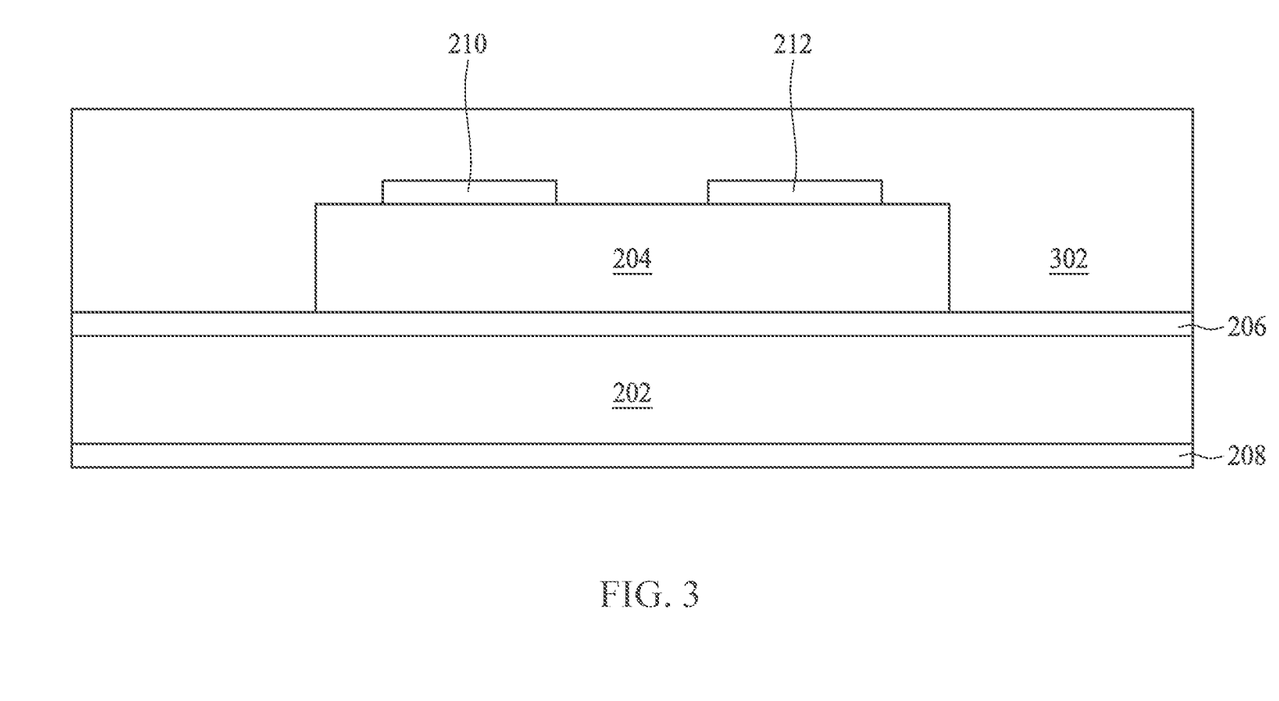
Figure 4:
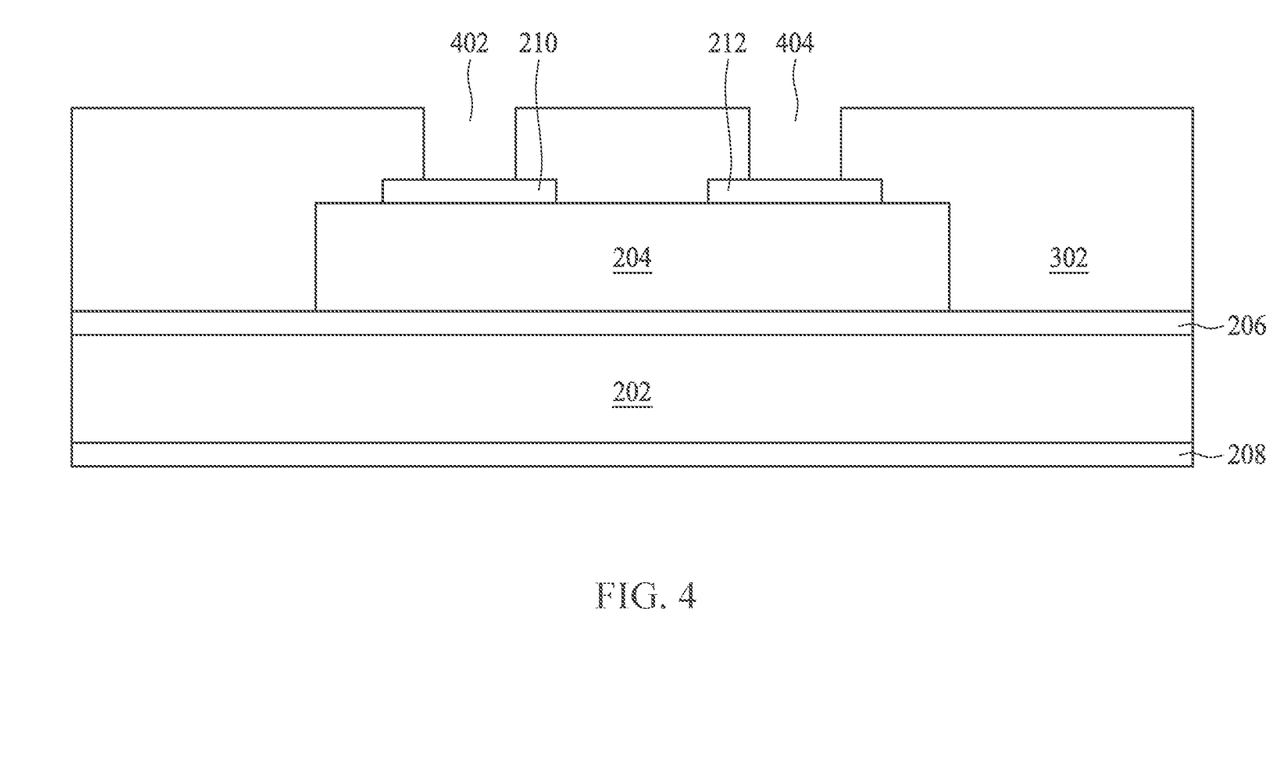
Figure 5:
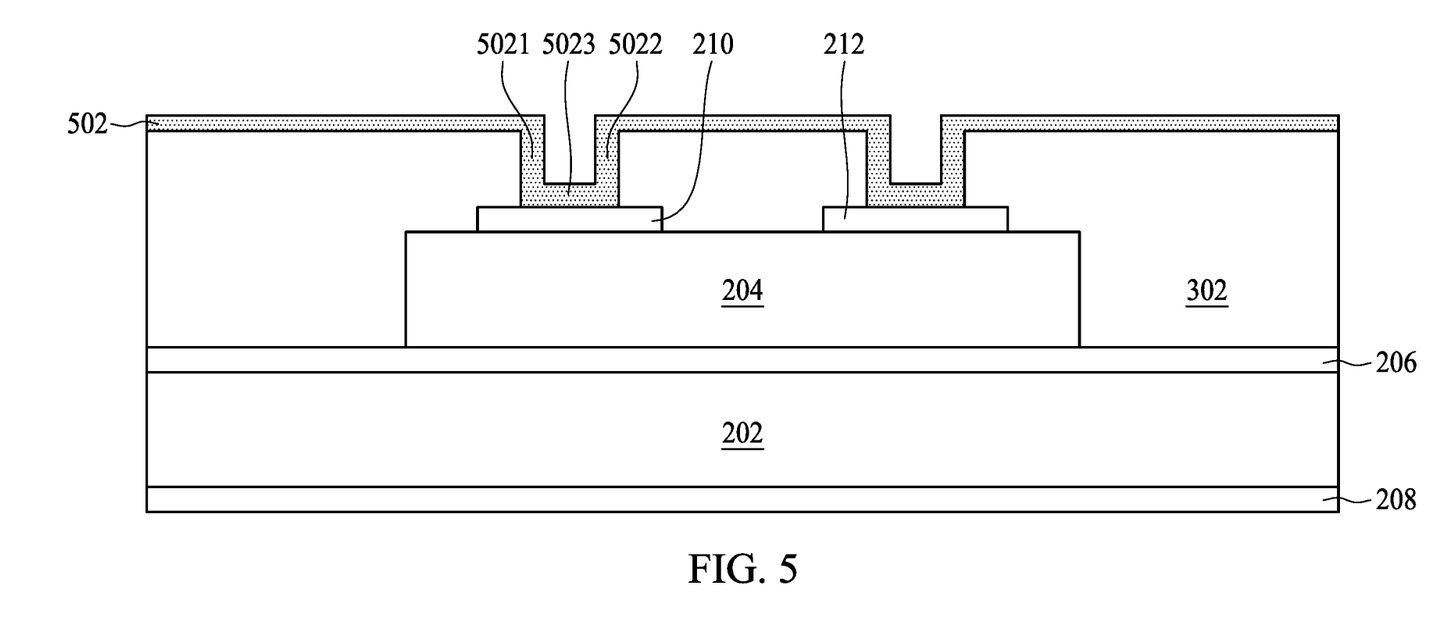

Next, as shown in FIG. 3, a second insulating layer 302 is adhered to the first insulating layer 206. The second insulating layer 302 covers the die 204, the first die pad 210 and the second die pad 212. Where the second insulating layer 302 is a photosensitive dry film including constituents selected from at least one of polyimide, epoxy resin, benzocyclobutene resin and polymer. In FIG. 4, an exposure development process is performed to transfer a predefined pattern to the second insulating layer 302 over the first die pad 210 and the second die pad 212. A portion of the second insulating layer 302 is removed, and therefore a first window 402 and a second window 404 are formed. Consequently, the first die pad 210 and the second die pad 212 can be exposed. In FIG. 5, a first metal layer 502 is deposited along a surface of the second insulating layer 302 and a profile of the first window 402 and the second window 404. The first metal layer 502 is used as a diffusion barrier layer between the first die pad 210 and the second die pad 212 and the subsequent metal layer in order to improve reliability of electrical characteristics, thus preventing copper atoms from drift or diffusion once copper is included in the following metal layer. The first metal layer 502 may include TiW, TiN, Ta, TaN, Ta—Si—N and WN. The first metal layer 502 covers a surface of the second insulating layer 302, a profile of the first window 402 and the second window 404, and the exposed first die pad 210 and the exposed second die pad 212 shown in FIG. 4.

Figure 6:
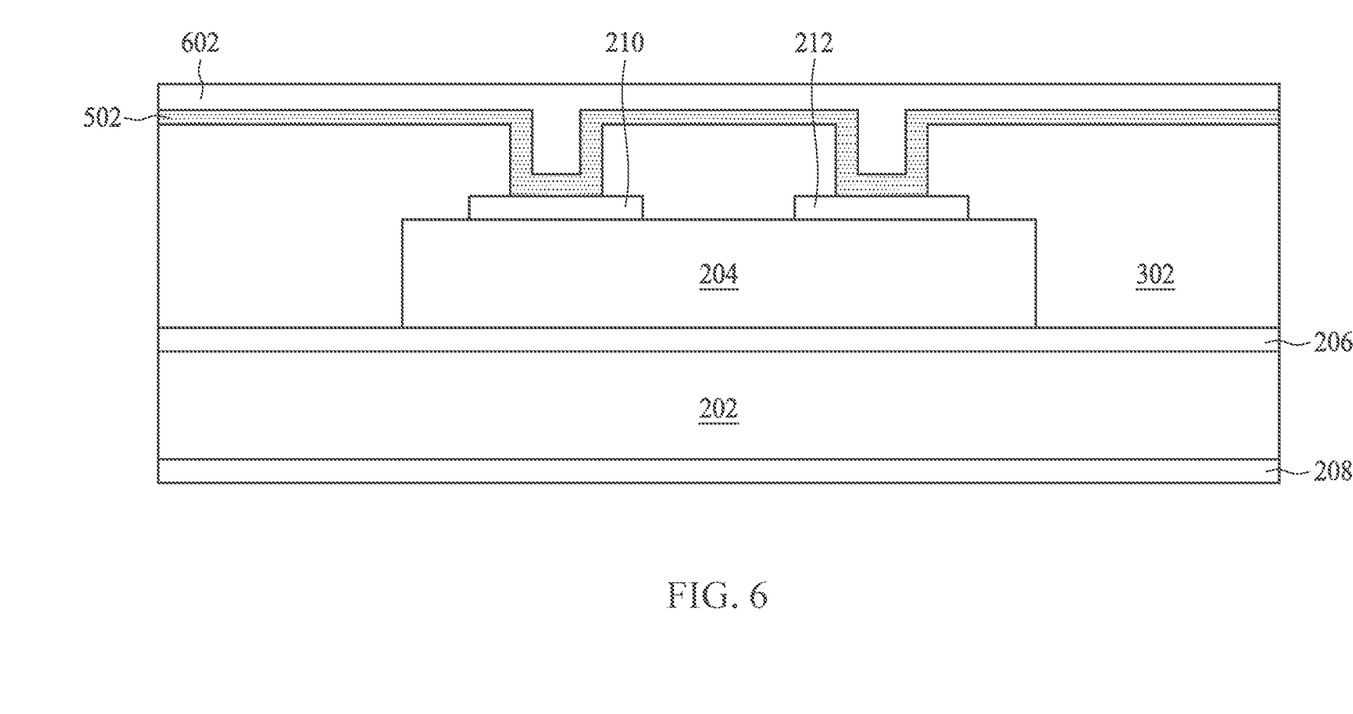
Figure 7:
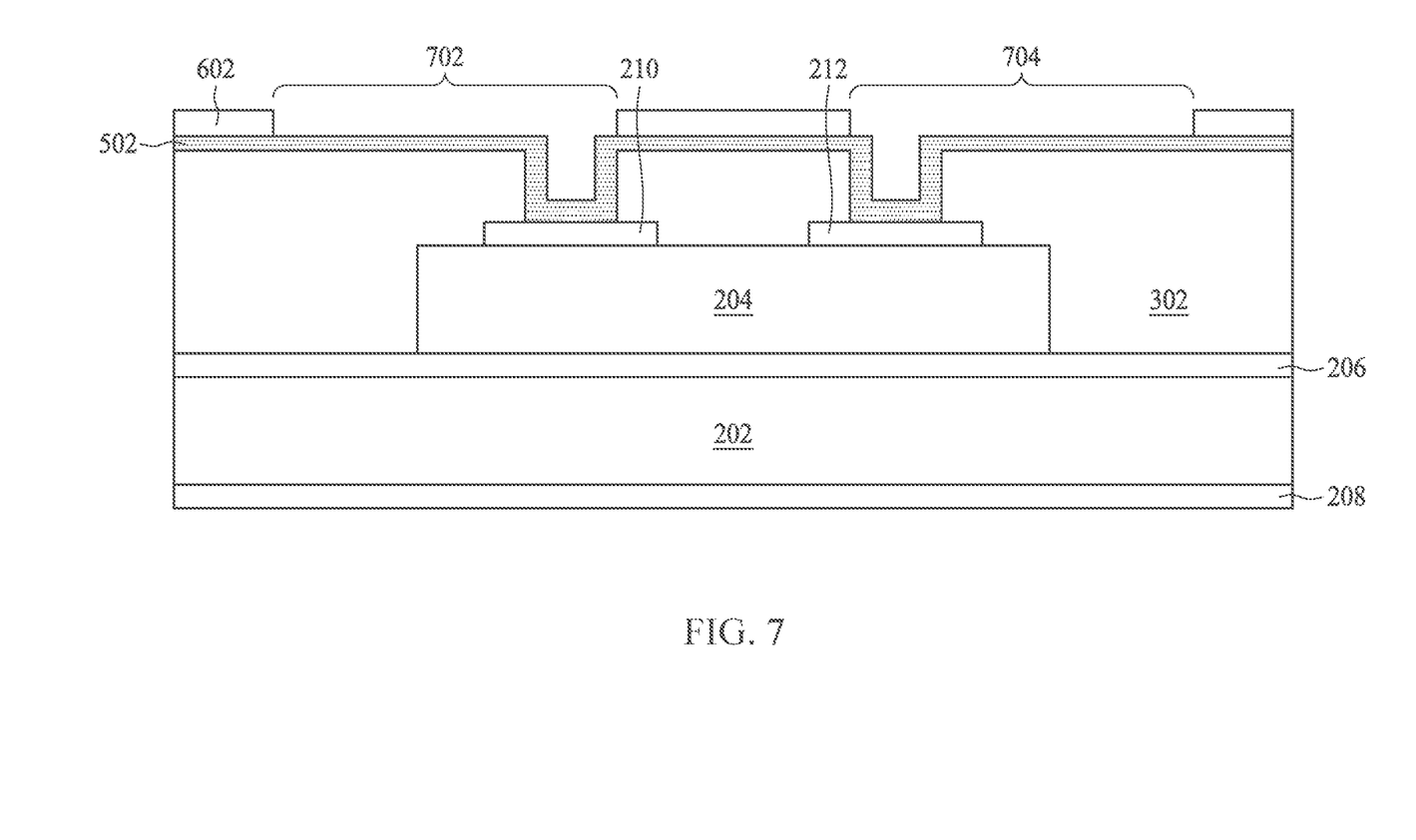
Figure 8:
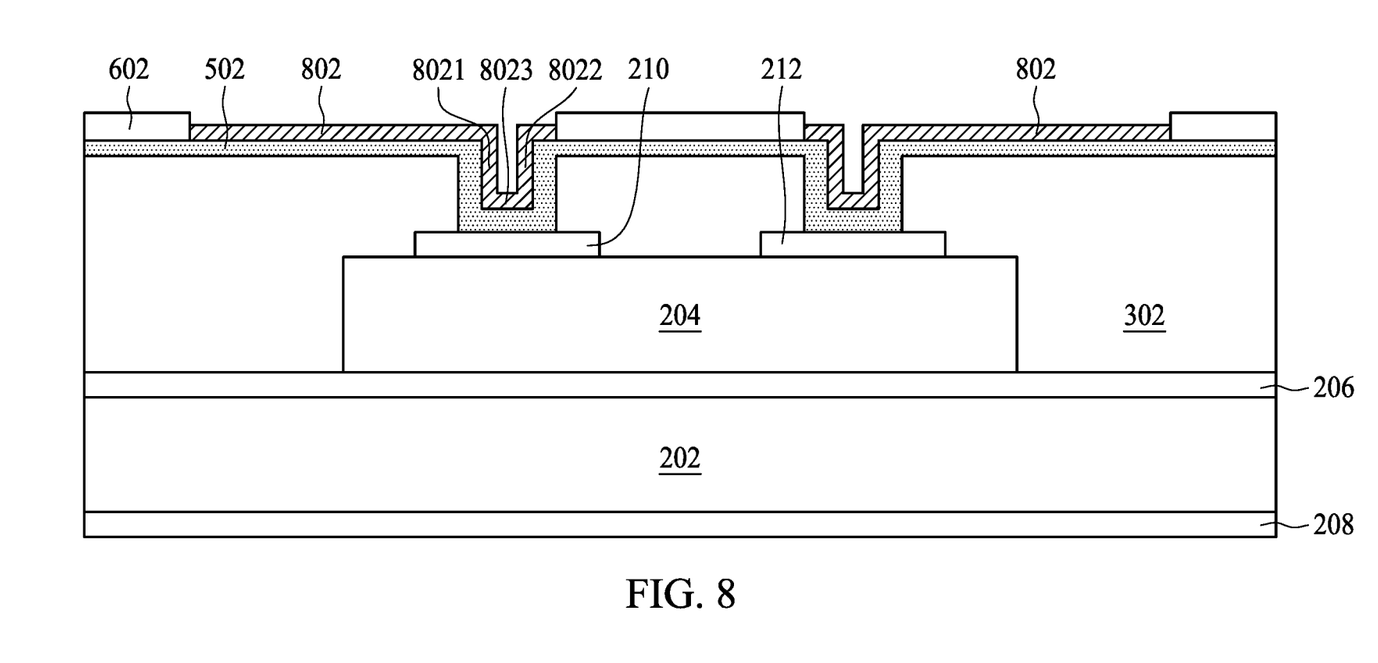
Figure 9:
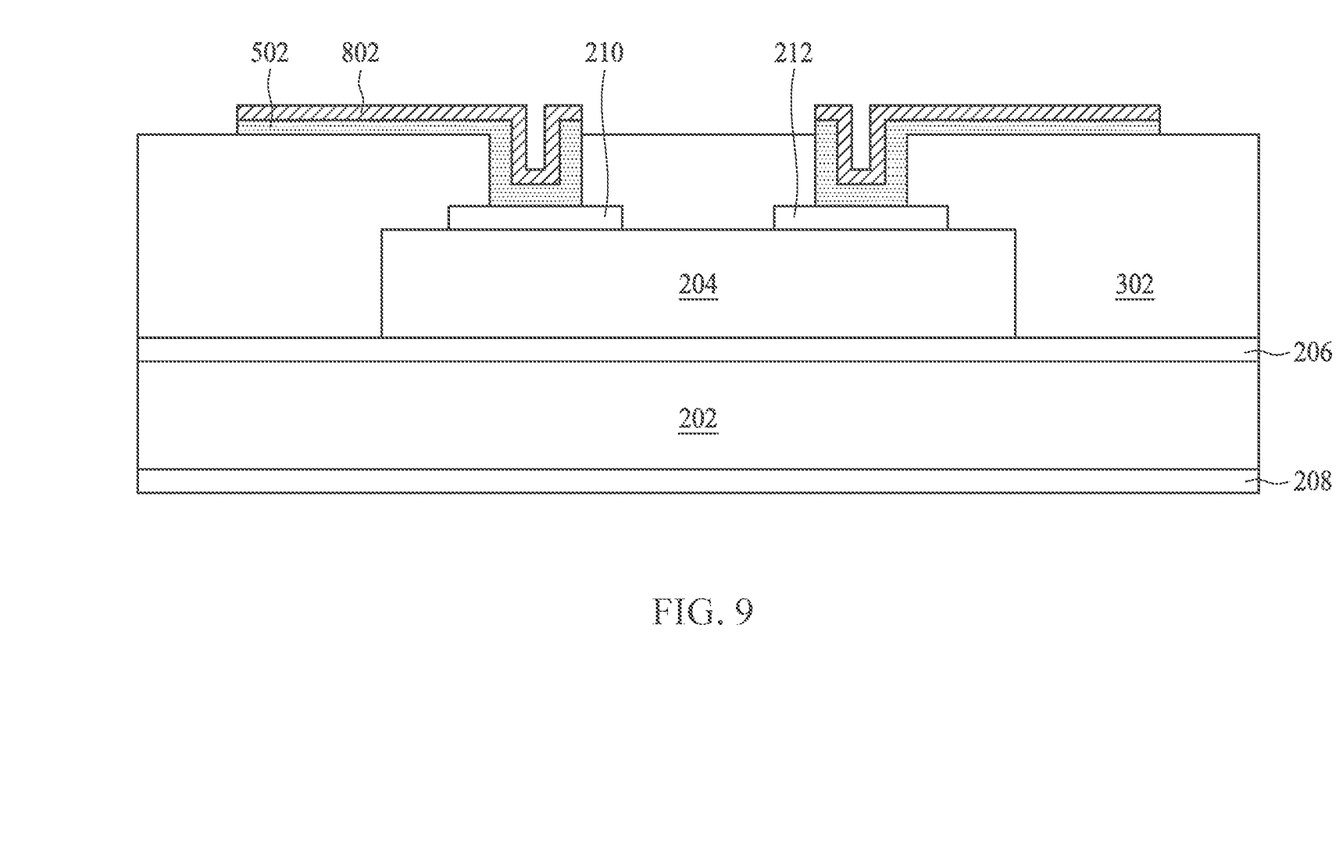
Figure 10:
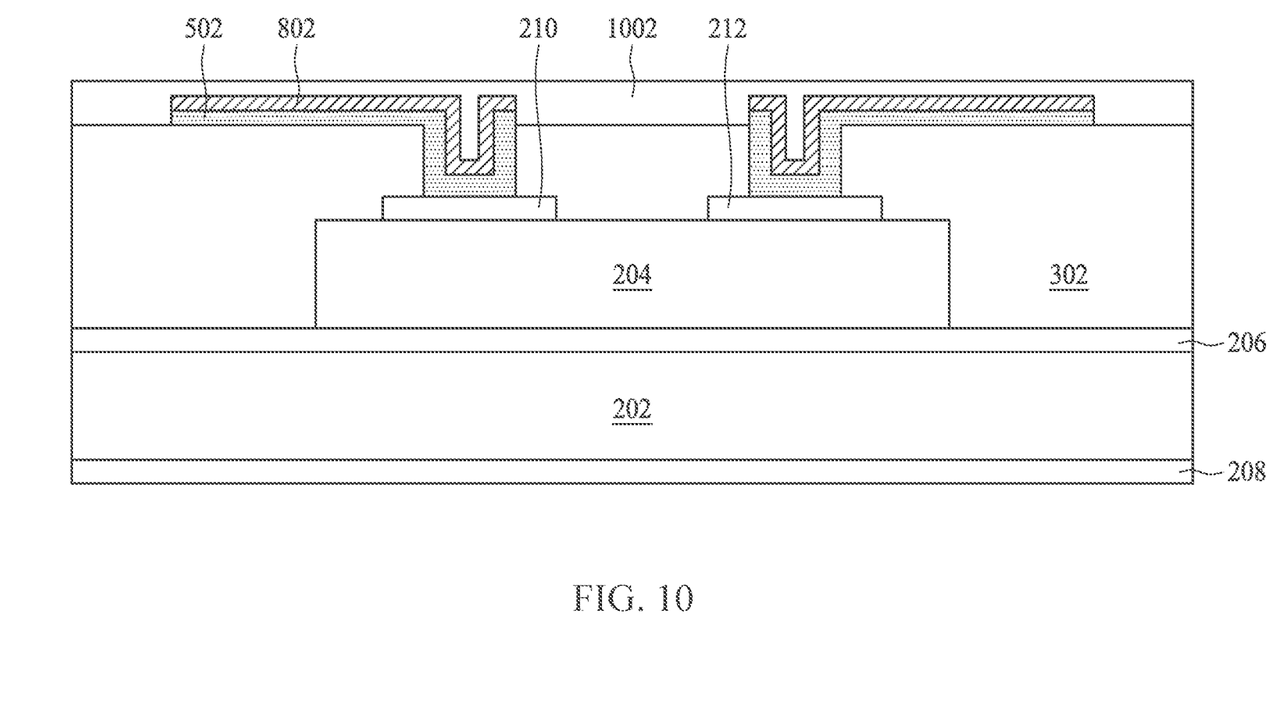
Figure 11:
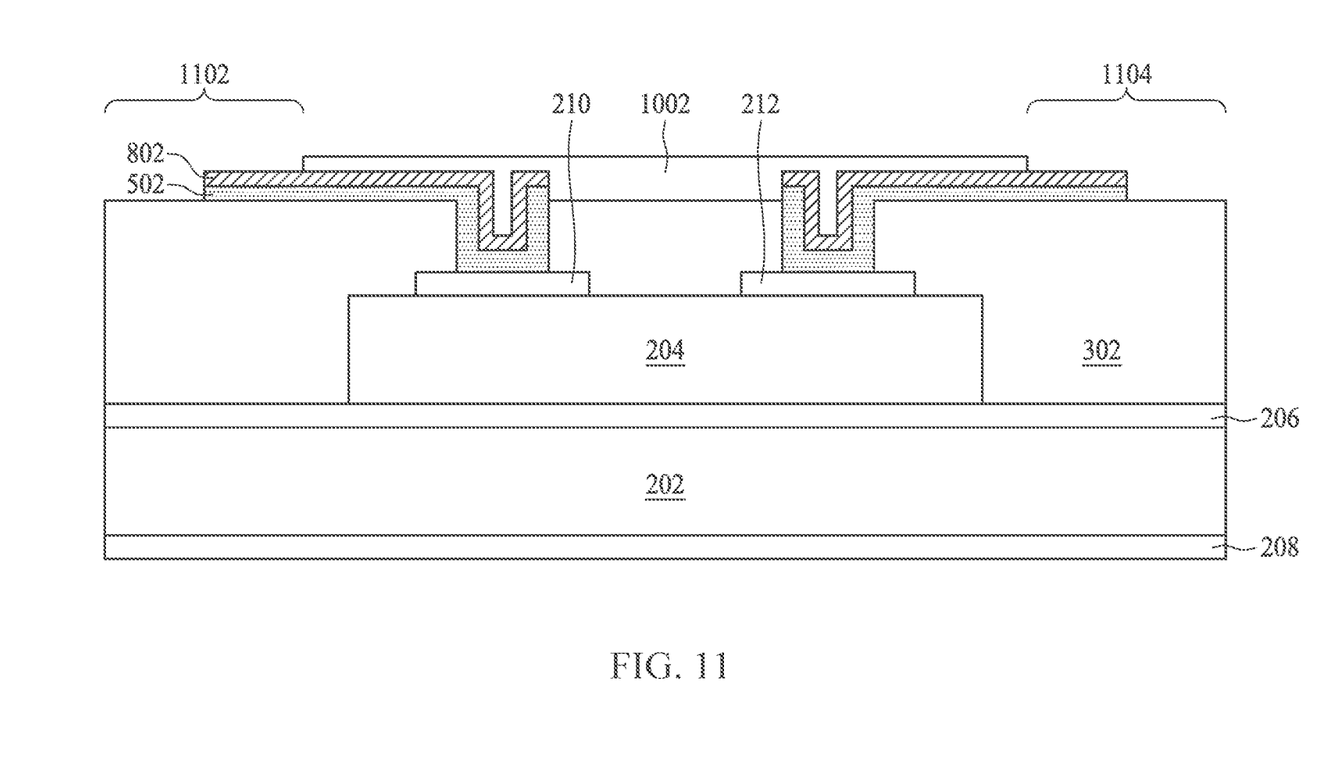

As shown in FIG. 6, a third insulating layer 602 is deposit on the first metal layer 502. An exposure development process is performed to transfer a pattern to form a third window 702 and a fourth window 704 as illustrated in FIG. 7. Then an electroplating process can be performed to deposit a second metal layer 802 in the third window 702 and the fourth window 704 in FIG. 8 as bonding pads. In some embodiments, after the first metal layer 502 is finished and before the electroplating process is started, a thin and continuous seed layer (not shown in FIG. 8) can be formed in order to improve adhesion and facilitate growth of copper during the electroplating process. The second metal layer 802 may be selected from at least one of Pd, Al, Cr, Ni, Ti, Au, Cu or Pt. Next, an insulating layer removing process can be used to strip out the third insulating layer 602 and a portion of the first metal layer 502 not covered by the second metal layer 802, as shown in FIG. 9. Then, a fourth insulating layer 1002 is deposited to cover the second insulating layer 302, the first metal layer 502 and the second metal layer 802 as depicted in FIG. 10. In FIG. 11, an exposure development process is performed to transfer a pattern and form a structure of a fifth window 1102 and a sixth window 1104, wherein the third insulating layer 602, the fourth insulating layer 1002 and the second insulating layer 302 may include the same materials.

Figure 12:
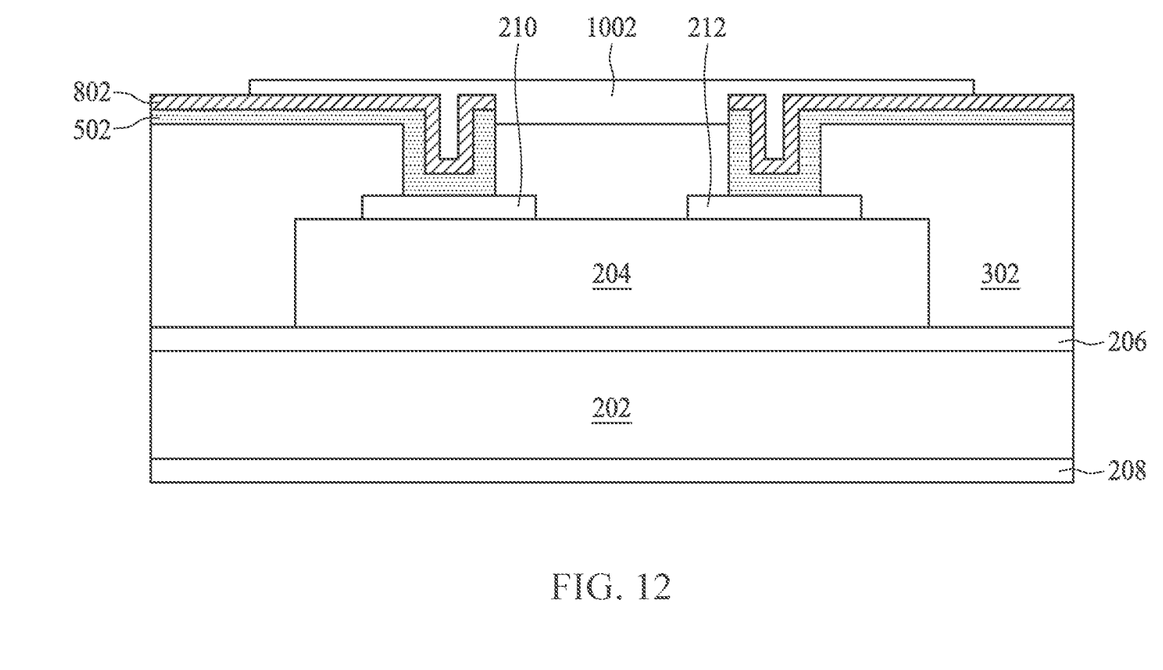
FIG. 12 is a cross-sectional view of a semiconductor package structure according to an embodiment of the disclosure.

It can be understood by referring to FIG. 11 that the first die pad 210 of the die 204 is coupled to a first portion (e.g. the left part of the second metal layer 802 of FIG. 11) of the second metal layer 802 via the first metal layer 502, and the second die pad 212 of the die 204 is coupled to a second portion (e.g. the right part of the second metal layer 802 of FIG. 11) of the second metal layer 802 via the first metal layer 502. The first portion and the second portion are spaced apart by insulating materials (e.g. the fourth insulating 1002 of FIG. 11). In addition, in this embodiment, it is optional to grind the substrate 202 according to a required thickness. Further, as mentioned above, when the substrate 202 includes a plurality of dies, the substrate 202 may be sawed based on the die number in order to obtain the single semiconductor package structure of FIG. 12. FIG. 12 is a cross-sectional view of a semiconductor package structure according to an embodiment of the disclosure. The semiconductor package structure may be flipped over to couple the second metal layer 802 to external circuits by solder. Consequently, the semiconductor package structure can communicate with the external circuits by electrical signals.

Figure 13:
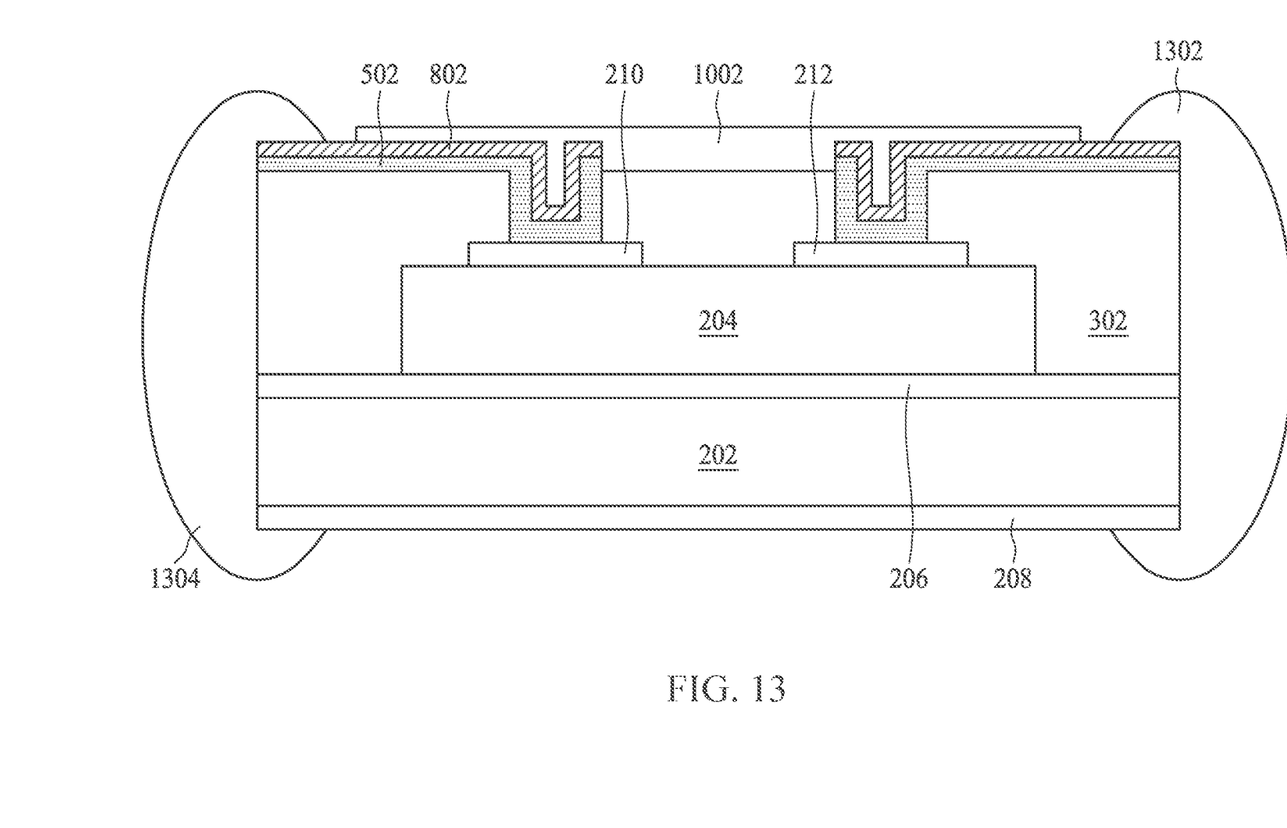
FIG. 13 is a cross-sectional view of a semiconductor package structure according to another embodiment of the disclosure.

FIG. 13 is a cross-sectional view of a semiconductor package structure according to another embodiment of the disclosure. In some embodiments, a dip silver/copper operation may be performed upon two terminals of the semiconductor of FIG. 12 as shown in FIG. 13, to form a first metal terminal 1302 and a second metal terminal 1304. The first metal terminal 1302 and the second metal terminal 1304 are silver or copper, and further plated by metal materials such as nickel and tin by a barrel plating operation. Please note that in some embodiments, the first metal terminal 1302 and the second metal terminal 1304 may include other types of metal, such as palladium, aluminum, chromium, nickel, titanium, gold or platinum. The semiconductor package structure of FIG. 13 may be soldered to the external circuits without being flipped over. In some embodiments, the semiconductor package structure of FIG. 13 may be disposed on an external circuit board upright, upside down or on its side, and communicates with the external circuit board by soldering. Thus, the facility can be greatly improved. In some embodiments, the die 204 may include three or more die pads. Therefore, three or more dip silver/copper metal terminals may be included in the semiconductor package structure.

Figure 14:
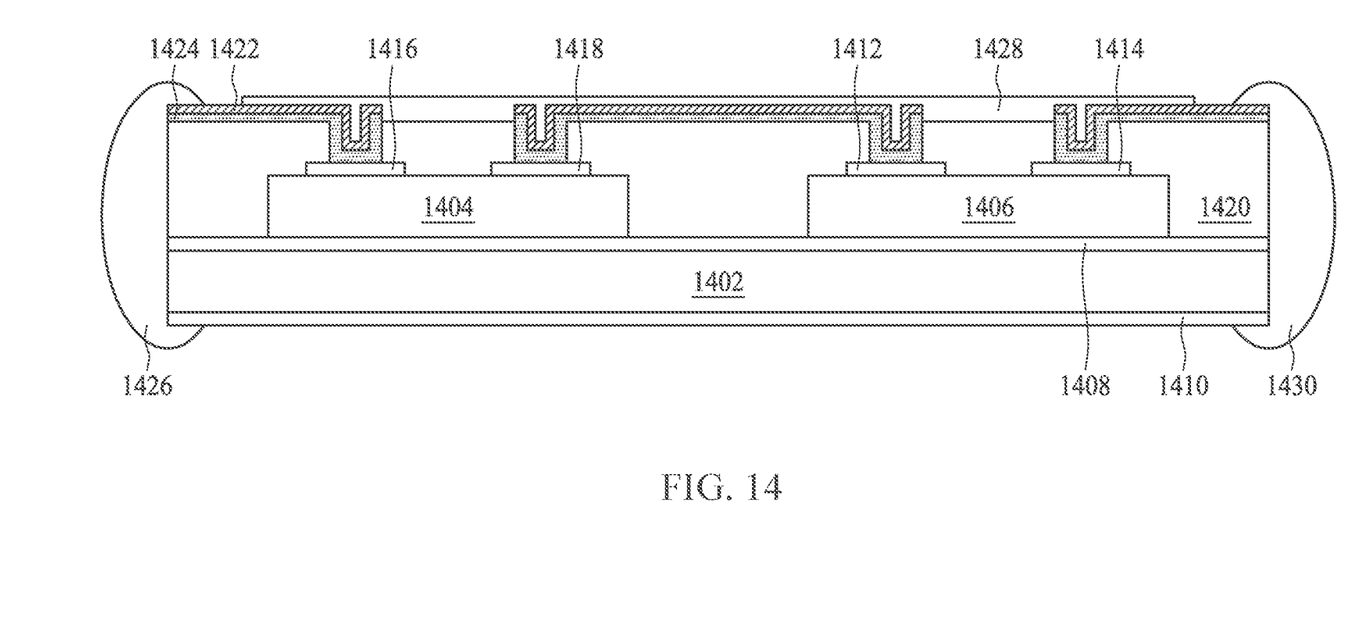
FIG. 14 is a cross-sectional view of a semiconductor package structure according to still another embodiment of the disclosure.

FIG. 14 is a cross-sectional view of a semiconductor package structure according to still another embodiment of the disclosure. The semiconductor package structure of FIG. 14 includes a first die 1404 and a second die 1406 adhered to a first insulating layer 1408 on a front side of the substrate 1402. A protection 1410 is optionally adhered to a back side of the substrate 1402. The first die 1404 includes a first die pad 1416 and a second die pad 1418; the second die 1406 includes a third die pad 1412 and a fourth die pad 1414. The semiconductor package structure of FIG. 14 further includes a second insulating layer 1420, a first metal layer 1424, a second metal layer 1422, a third insulating layer 1428, a first metal terminal 1426 and a second metal terminal 1430. The second die pad 1418 of the first die 1404 is coupled to the third die pad 1412 of the second die 1406 via a second portion of the first metal layer 1424 and the second metal layer 1422. The first die pad 1416 of the first die 1404 is coupled to the first metal terminal 1426 via a first portion of the first metal layer 1424 and the second metal layer 1422. The fourth die pad 1414 of the second die 1406 is coupled to the second metal terminal 1430 via a third portion of the first metal layer 1424 and the second metal layer 1422.

The first die 1404 and the second die 1406 of the embodiment of FIG. 14 may be capacitors to be packaged. By using the semiconductor package structure shown in FIG. 14, the first die 1404 and the second die 1406 may be serially connected to perform a function different from separately adopting each single capacitor. In some embodiments, one or more dies may be connected in serial/parallel by using the semiconductor package method mentioned above. The inner metal layers may be utilized to connect some die pads of the dies to each other according to design requirements, and coupling some die pads requires communication with external circuits to metal terminals at two sides of the substrate.

The dies mentioned in the disclosure are not limited to any specific components. The dies mentioned in the disclosure may be any digital components, analog components, mix-signal components or active/passive components, such as capacitors, resistors, inductors, transient-voltage-suppression (TVS) diode or computers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor packaging method, comprising:
providing a substrate, comprising a front side and a back side;
disposing a first insulating layer on the front side of the substrate;
forming a protection layer on the back side of the substrate;
disposing a die on the first insulating layer, wherein the die comprises a first die pad and a second die pad;
disposing a second insulating layer on the first insulating layer, the die, the first die pad and the second die pad, wherein the second insulating layer is a single structure that is a photosensitive dry film comprising constituents selected from at least one of polyimide, epoxy resin, benzocyclobutene resin and polymer and in direct contact with an entirety of sidewalls and a top surface of the die;
removing a portion of the second insulating layer to form a first window and a second window, so as to expose the first die pad and the second die pad;
disposing a first metal layer along the second insulating layer, and a profile of the first window and the second window, and the first metal layer being coupled to the first die pad and the second die pad;
disposing a third insulating layer on the first metal layer;

removing a portion of the third insulating layer to form a third window and a fourth window, so as to expose the first metal layer;

disposing a second metal layer on the first metal layer in the third window and the fourth window;

removing the third insulating layer and a portion of the first metal layer;

forming a first metal terminal on a terminal of the substrate, wherein the first metal terminal is formed to cross the second metal layer and the protection layer; and forming a second metal terminal on another terminal of the substrate, wherein the second metal terminal is formed to cross the second metal layer and the protection layer, and wherein at least a portion of a top surface of the second metal layer is exposed; wherein the first and second metal terminals are formed by a silver/copper dip operation wherein the first metal layer includes a recessed portion and protrudes toward the die;

wherein a portion of the second metal layer is disposed in the recessed portion, and the second metal layer includes a bottom surface protrudes toward the first die pad and the second die pad.

2. The semiconductor packaging method of claim 1, further comprising:
disposing a fourth insulating layer on the second metal layer; and
removing a portion of the fourth insulating layer to form a fifth window and a sixth window, so as to expose a portion of the second metal layer.

3. The semiconductor packaging method of claim 1, wherein the second metal layer is selected from at least one of palladium, aluminum, chromium, nickel, titanium, gold, copper and platinum.

4. The semiconductor packaging method of claim 2, wherein the first insulating layer, the third insulating layer and the fourth insulating layer are photosensitive dry films comprising constituents selected from at least one of polyimide, epoxy resin, benzocyclobutene resin and polymer.

5. The semiconductor packaging method of claim 4, wherein the first metal terminal is coupled to the second metal layer exposed by the fifth window; and
wherein the second metal terminal is coupled to the second metal layer exposed by the sixth window.

6. The semiconductor packaging method of claim 5, wherein the first metal terminal and the second metal terminal are selected from at least one of silver and copper.

* * * * *